US010297963B2

(12) United States Patent
Herring et al.

(10) Patent No.: US 10,297,963 B2
(45) Date of Patent: May 21, 2019

(54) DUAL CONNECTOR SYSTEM

(71) Applicant: TE CONNECTIVITY CORPORATION, Berwyn, PA (US)

(72) Inventors: Michael David Herring, Apex, NC (US); Nathan Lincoln Tracy, Harrisburg, PA (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 0 days.

(21) Appl. No.: 15/685,069

(22) Filed: Aug. 24, 2017

(65) Prior Publication Data
US 2018/0076587 A1 Mar. 15, 2018

Related U.S. Application Data

(60) Provisional application No. 62/395,168, filed on Sep. 15, 2016.

(51) Int. Cl.
| | |
|---|---|
| *H01R 27/02* | (2006.01) |
| *H05K 7/14* | (2006.01) |
| *H01R 13/6587* | (2011.01) |
| *H01R 13/11* | (2006.01) |
| *H01R 12/71* | (2011.01) |
| *H01R 13/52* | (2006.01) |

(Continued)

(52) U.S. Cl.
CPC ........... *H01R 27/02* (2013.01); *H01R 12/716* (2013.01); *H01R 13/113* (2013.01); *H01R 13/6587* (2013.01); *H05K 7/1445* (2013.01); *H01R 12/7076* (2013.01); *H01R 12/714* (2013.01); *H01R 13/5219* (2013.01); *H01R 13/6275* (2013.01); *H01R 24/005* (2013.01); *H01R 24/60* (2013.01); *H01R 31/005* (2013.01); *H01R 2107/00* (2013.01)

(58) Field of Classification Search
CPC .. H01R 13/7132; H01R 13/71; H01R 13/635; H01R 13/6315
USPC ....... 439/638, 639, 645, 668, 660, 842, 344, 439/540.1, 541.5
See application file for complete search history.

(56) References Cited

U.S. PATENT DOCUMENTS

| | | |
|---|---|---|
| 3,479,634 A | 11/1969 | Pritulsky |
| 4,678,252 A | 7/1987 | Moore |

(Continued)

OTHER PUBLICATIONS

Tyco Electronic, Product Specification, DDR S.O.DIMM Socket 200 Positions, Jul. 11, 2007, 5 pages.

(Continued)

*Primary Examiner* — Harshad C Patel

(57) ABSTRACT

A dual connector system includes a host circuit board with first and second electrical connectors. The first electrical connector has a housing with a card slot. The second electrical connector has a housing having a latch member including a latching tab. The dual connector system includes a dual connector module having a module circuit board having contact pads. The dual connector module has a latching element that engages the latching tab to hold the dual connector module in the mated position with the first electrical connector and the second electrical connector. The dual connector system includes an ejector actuated to release the latching tab from the latch member to allow the dual connector module to unmate from the electrical connectors.

20 Claims, 6 Drawing Sheets

(51) Int. Cl.
*H01R 31/00* (2006.01)
*H01R 12/70* (2011.01)
*H01R 13/627* (2006.01)
*H01R 24/00* (2011.01)
*H01R 24/60* (2011.01)
*H01R 107/00* (2006.01)

(56) References Cited

U.S. PATENT DOCUMENTS

| | | | |
|---|---|---|---|
| 5,242,312 A | 9/1993 | Tondreault | |
| 5,260,854 A | 11/1993 | Hileman et al. | |
| 5,324,204 A * | 6/1994 | Lwee | G06F 1/184 |
| | | | 361/679.32 |
| 5,643,001 A * | 7/1997 | Kaufman | H01R 13/6485 |
| | | | 439/159 |
| 6,394,817 B1 | 5/2002 | Kihira et al. | |
| 7,018,222 B2 * | 3/2006 | Chang | H01R 13/633 |
| | | | 439/159 |
| 7,074,090 B2 | 7/2006 | Ho et al. | |
| 7,101,222 B2 | 9/2006 | Ho et al. | |
| 7,300,298 B2 | 11/2007 | Kameda | |
| 7,344,402 B2 | 3/2008 | Langgood et al. | |
| 7,467,963 B2 | 12/2008 | Chen | |
| 7,470,136 B2 | 12/2008 | Yahiro et al. | |
| 7,510,414 B2 * | 3/2009 | Yu | H01R 27/02 |
| | | | 439/159 |
| 7,909,644 B1 | 3/2011 | Li et al. | |
| 7,987,584 B2 | 8/2011 | Barna et al. | |
| 8,113,883 B2 * | 2/2012 | Chen | H01R 13/6582 |
| | | | 439/607.33 |
| 8,544,831 B2 | 10/2013 | Klein et al. | |
| 8,588,561 B2 * | 11/2013 | Zbinden | G02B 6/4232 |
| | | | 385/14 |
| 8,764,457 B2 * | 7/2014 | Chen | H05K 7/142 |
| | | | 361/810 |
| 8,787,711 B2 | 7/2014 | Zbinden et al. | |
| 9,166,315 B1 | 10/2015 | Phillips et al. | |
| 9,871,325 B2 | 1/2018 | Patel et al. | |
| 9,972,927 B2 | 5/2018 | Nichols et al. | |
| 9,991,615 B1 | 6/2018 | Herring et al. | |
| 2007/0099470 A1 | 5/2007 | Yang | |
| 2010/0165592 A1 | 7/2010 | Takao | |
| 2012/0327576 A1 | 12/2012 | Xiao et al. | |
| 2014/0094063 A1 | 4/2014 | Daly | |
| 2014/0111931 A1 | 4/2014 | Casserly et al. | |
| 2014/0179167 A1 | 6/2014 | Long et al. | |
| 2015/0318633 A1 | 11/2015 | Herring et al. | |
| 2016/0134040 A1 | 5/2016 | Phillips et al. | |
| 2018/0309213 A1 | 10/2018 | Harmon et al. | |

OTHER PUBLICATIONS

TE Connectivity Emboss Assembly DDR1 & DDR2 SODIMM Socket 200P Standard Profile Standard Type, Drawing No. C-1565917, Dec. 2001, 1 page.
U.S. Appl. No. 15/458,099, filed Mar. 14, 2017.
U.S. Appl. No. 15/490,252, filed Apr. 18, 2017.
U.S. Appl. No. 15/492,070, filed Apr. 20, 2017.
U.S. Appl. No. 15/723,287, filed Oct. 3, 2017.

* cited by examiner

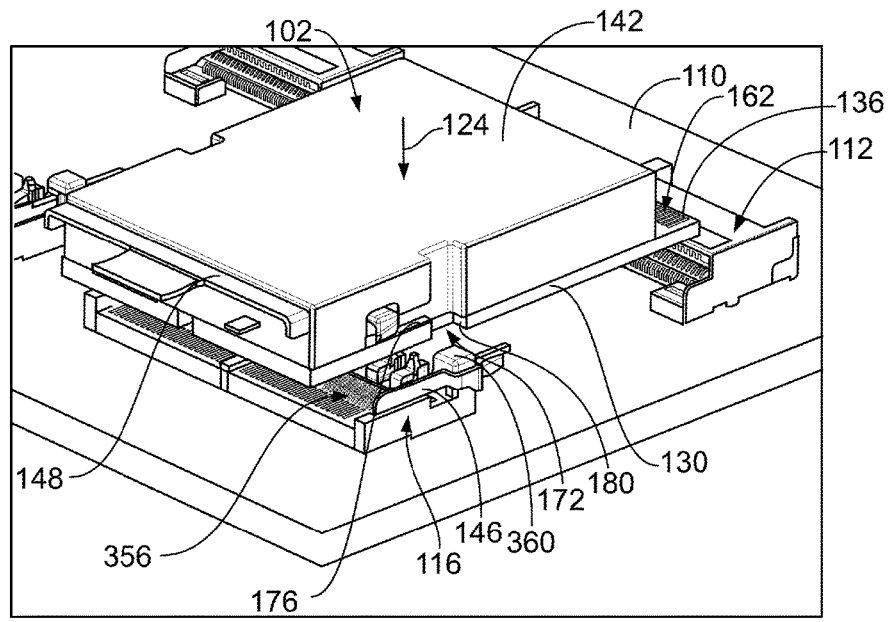
FIG. 7
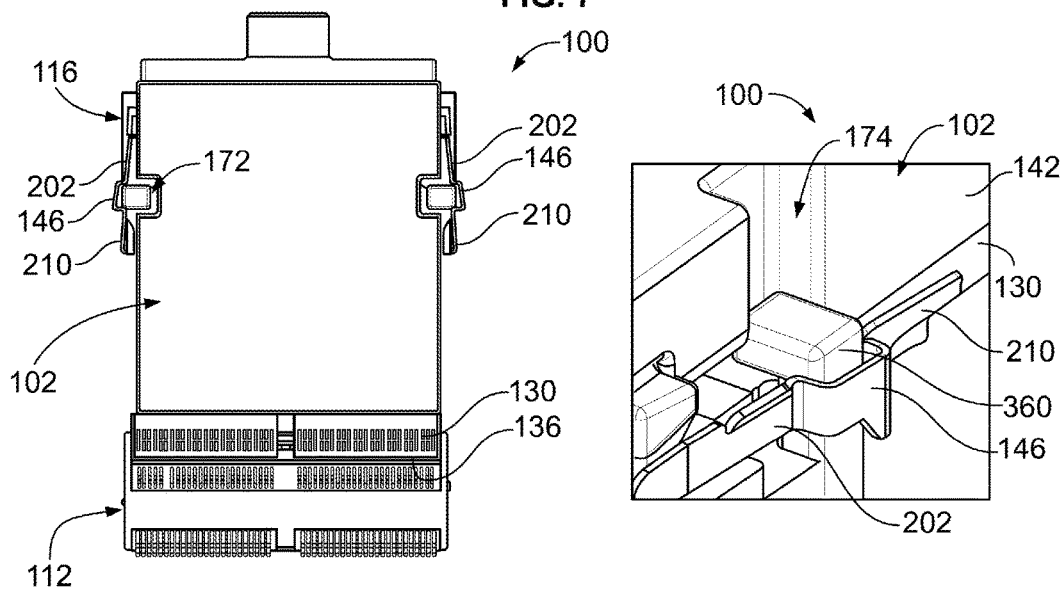
FIG. 10  FIG. 11

DUAL CONNECTOR SYSTEM

CROSS REFERENCE TO RELATED APPLICATIONS

This application claims the benefit of U.S. Provisional Application No. 62/395,168 filed Sep. 15, 2016, entitled "LATCH RETENTION AND RELEASE MECHANISM FOR AN ELECTRONIC MODULE", the subject matter of which is herein incorporated by reference in its entirety.

BACKGROUND OF THE INVENTION

The subject matter herein relates generally to a mechanism for releasably securing a dual connector module in a dual connector system.

Electrical connectors are known for connecting an electronic module to a host circuit board. Such connectors are typically mounted on the host circuit board and retained on the host circuit board by soldering or some other retention feature. The electronic module must be installed in the connector and retained in the connector to provide a reliable electrical interconnection between the module and the host circuit board.

One type of electronic module includes a circuit card having a first set of contact pads along a card edge and a second set of contact pads along a bottom face of the circuit card. The first set of contacts mate with a card edge connector on the host circuit board, and the second set of contacts mate with a Z-axis connector on the host circuit board. The module is installed on the host circuit board by first moving the module downward along a Z-axis toward the host circuit board, and then translating the module horizontally along the host circuit board to install the card edge into the right angle connector. In this position the first set of contact pads are electrically connected to contacts in the right angle connector, and the second set of contact pads are electrically connected to contacts in the Z-axis connector. The module must be retained in this position to maintain the electrical connections.

There may be a need to remove the electronic module such as for replacement or upgrade. The module may be mounted in close proximity to other components on the host circuit board, thereby making it difficult to access the module and associated retention mechanism.

Accordingly, there is a need for a mechanism that securely retains an electronic module in a mated condition with an electrical connector and that can be disengaged to allow release of the module in tight spaces.

BRIEF DESCRIPTION OF THE INVENTION

In one embodiment, a dual connector system is provided including a host circuit board having a front mounting area and a rear mounting area with a first electrical connector at the front mounting area of the host circuit board and a second electrical connector at the rear mounting area of the host circuit board. The first electrical connector has a housing having a card slot. The second electrical connector has a housing having an upper mating surface. The second electrical connector has a latch member coupled to the housing having a latching tab. The dual connector system includes a dual connector module movable between a mated position and an unmated position with the first and second electrical connectors. The dual connector module has a module circuit board including an upper surface and a lower surface facing the host circuit board with at least one communication component on the upper surface. The module circuit board has first and second side edges extending between a front edge and a rear edge. The module circuit board has front contact pads proximate to the front edge for electrically connecting to the first electrical connector and rear contact pads remote from the front edge for electrically connecting to the second electrical connector. The dual connector module has a latching element proximate to the rear contact pads that engages the latching tab to hold the dual connector module in the mated position with the first electrical connector and the second electrical connector. The dual connector system includes an ejector coupled to the dual connector module actuated to release the latching tab from the latch member to allow the dual connector module to unmate from the first electrical connector and the second electrical connector.

In another embodiment, a dual connector system is provided including a host circuit board having a front mounting area and a rear mounting area with a first electrical connector at the front mounting area of the host circuit board and a second electrical connector at the rear mounting area of the host circuit board. The first electrical connector has a housing having a card slot holding first contacts at the card slot that are terminated to the host circuit board. The second electrical connector has a housing having an upper mating surface holding second contacts at the upper mating surface that are terminated to the host circuit board. The second electrical connector includes a latch member coupled to the housing having a latching tab. The dual connector system includes a dual connector module movable between a mated position and an unmated position with the first and second electrical connectors. The dual connector module has a module circuit board including an upper surface and a lower surface facing the host circuit board with at least one communication component on the upper surface. The module circuit board has first and second side edges extending between a front edge and a rear edge. The module circuit board has front contact pads proximate to the front edge for electrically connecting to the first electrical connector and rear contact pads remote from the front edge for electrically connecting to the second electrical connector. The dual connector module has a latching element proximate to the rear contact pads that engages the latching tab to hold the dual connector module in the mated position with the first electrical connector and the second electrical connector. The dual connector module is coupled to the host circuit board by lowering the dual connector module in a loading direction generally perpendicular to the host circuit board to a pre-staged, unmated position where the first connector interface is adjacent to the first electrical connector and the second connector interface is adjacent to the second electrical connector. The dual connector module is slid forward from the pre-staged, unmated position to a mated position in a mating direction generally parallel to the upper surface of the host circuit board to mate the first connector interface to the first electrical connector by loading the front edge of the module circuit board into the card slot of the first electrical connector to mate the first contacts to the first contact pads and to mate the second connector interface to the second electrical connector to mate the second contacts to the second contact pads. The dual connector system includes an ejector coupled to the dual connector module actuated to release the latching tab from the latch member to allow the dual connector module to unmate from the first electrical connector and the second electrical connector and move to the unmated position.

BRIEF DESCRIPTION OF THE DRAWINGS

FIG. 7 shows the dual connector module poised for coupling to the host circuit board at an elevated positioned above the host circuit board.

FIG. 10 is a top view of a portion of the dual connector system in a pre-staged position on the host circuit board.

FIG. 11 is a perspective view of a portion of the dual connector system in a pre-staged position on the host circuit board.

DETAILED DESCRIPTION OF THE INVENTION

Figure 1:
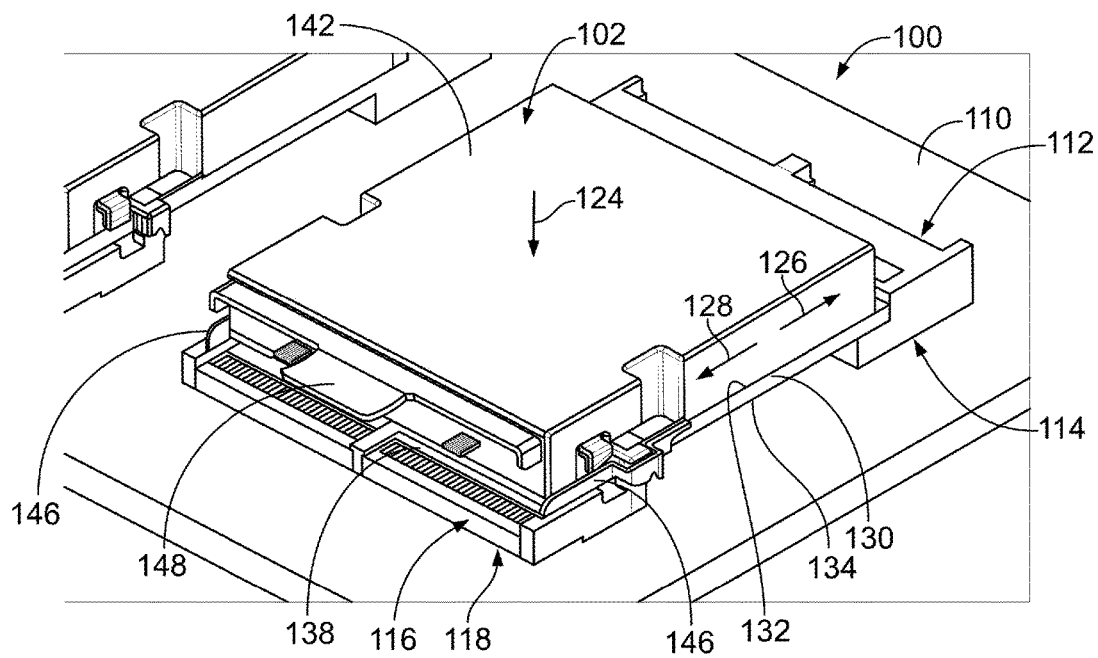
FIG. 1 is a perspective view of a dual connector system formed in accordance with an exemplary embodiment showing a dual connector module mounted to a host circuit board.

FIG. 1 is a perspective view of a dual connector system 100 formed in accordance with an exemplary embodiment showing a dual connector module 102 mounted to a host circuit board 110. The host circuit board 110 has a first electrical connector 112 at a front mounting area 114 of the host circuit board 110 and a second electrical connector 116 at a rear mounting area 118 of the host circuit board 110.

When the dual connector module 102 is mounted to the host circuit board 110, the dual connector module 102 interfaces with both electrical connectors 112, 116. Optionally, the dual connector module 102 may be simultaneously mated with the first and second electrical connectors 112, 116 during a mating process. In an exemplary embodiment, the first electrical connector 112 is a different type of electrical connector than the second electrical connector 116. For example, the first electrical connector 112 may be a front loaded electrical connector, such as a card edge connector. The second electrical connector 116 may be a top loaded electrical connector, such as a Z-axis connector or a mezzanine connector. The electrical connectors 112, 116 may be used for different types of signaling. For example, the first electrical connector 112 may be used for high-speed signaling while the second electrical connector 116 may be used for low speed signaling, powering, or for another type of connection.

In an exemplary embodiment, mating of the dual connector module 102 to the host circuit board 110 occurs by loading the dual connector module 102 in a loading direction 124 (for example, downward) to a pre-staged position and then mating the dual connector module 102 in a mating direction 126 (for example, forward) to a mated position. The dual connector module 102 may be unmated in an opposite unmating direction 128 (for example, rearward) to an unmated position and then removed from the host circuit board 110 by lifting the dual connector module 102 upward. The loading direction 124 may be perpendicular to the host circuit board 110, such as in a vertical direction, and the mating and unmating directions 126, 128 may be parallel to the host circuit board 110, such as in horizontal directions.

The dual connector module 102 includes a module circuit board 130 having an upper surface 132 and a lower surface 134. The module circuit board 130 extends between a front edge 136 (shown in FIG. 2) and a rear edge 138. The lower surface 134 faces the host circuit board 110 and may be parallel to and spaced apart from the host circuit board 110 when mated to the electrical connectors 112, 116.

In an exemplary embodiment, the dual connector module 102 includes one or more communication components 140 (shown in phantom in FIG. 2) on the upper surface 132 and/or the lower surface 134. The communication components 140 may be electrical components, optical components, or other types of components. In an exemplary embodiment, one or more of the communication components 140 may be on-board optical modules. The communication components 140 may include optical/digital converters for converting between optical and electrical signals. Other types of communication components 140 may be provided on the module circuit board 130, such as processors, memory modules, antennas, or other types of components.

In an exemplary embodiment, the dual connector module 102 includes a shell or housing 142 on the upper surface 132. The housing 142 encloses the communication components 140. In an exemplary embodiment, the housing 142 extends generally around the perimeter of the module circuit board 130; however, portions of the module circuit board 130 may be exposed exterior of the housing 142. Optionally, the dual connector module 102 may include a heat sink (not shown) thermally coupled to one or more of the communication components 140 and/or the housing 142 to dissipate heat from the communication components 140. The heat sink may have a plurality of fins having a large surface area for dissipating heat.

In an exemplary embodiment, the second electrical connector 116 includes latch members 146 for latchably securing the dual connector module 102 to the first electrical connector 112 and the second electrical connector 116. The latch members 146 engage opposite sides of the dual connector module 102, such as the module circuit board 130 and/or the housing 142. The latch members 146 are moveable between latched positions and unlatched positions. The latch members 146 may be unlatched to allow removal of the dual connector module 102 from the first and second electrical connectors 112, 116. An ejector 148 is coupled to the dual connector module 102 and operably coupled to the latch members 146 for releasing the latch members 146. In the illustrated embodiment, the ejector 148 is provided at the rear end of the dual connector module 102 and is accessible from behind the dual connector module 102 for actuation. The ejector 148 may be used to unmate the dual connector module 102 from the first connector module 112. For example, the ejector 148 may be pulled rearward to pull the front edge 136 out of the first electrical connector 112. In various embodiments, the ejector 148 may be actuated by pushing downward on the ejector 148 to engage the latch members 146. In other embodiments, the ejector 148 may be pushed forward, pulled upward or pulled rearward to actuate rather than pushing downward. Once the latch members 146 are released, the dual connector module 102 is able to be moved rearward in the unmating direction 128.

Figure 2:
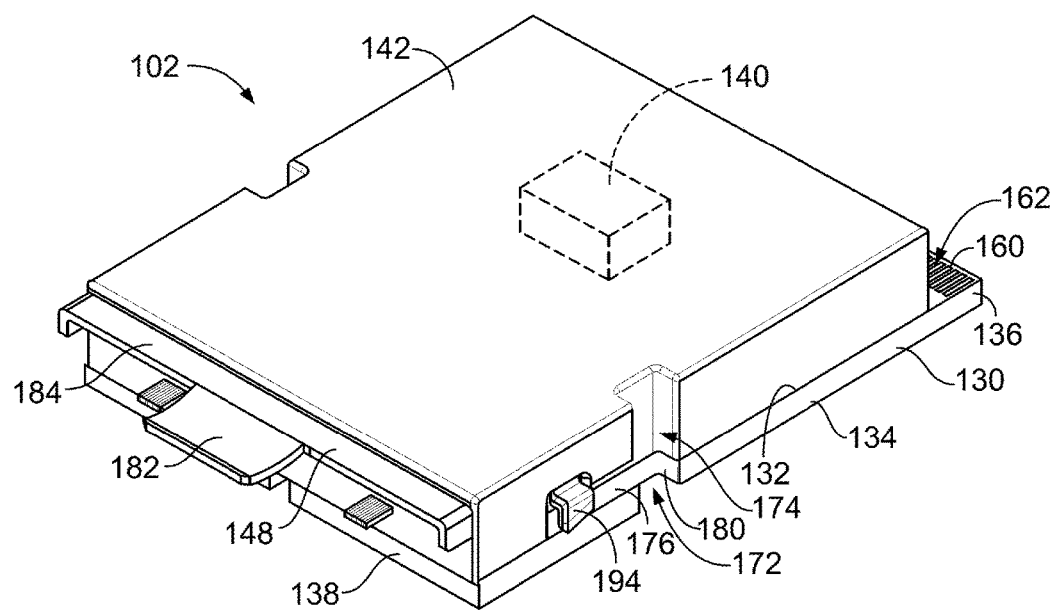
FIG. 2 is a top perspective view of the dual connector module in accordance with an exemplary embodiment.
Figure 3:
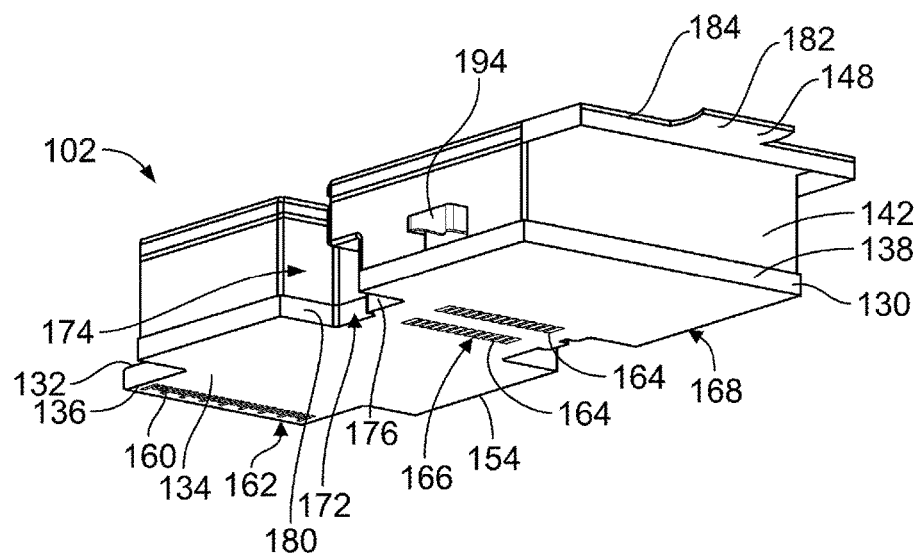
FIG. 3 is a bottom perspective view of the dual connector module in accordance with an exemplary embodiment.

FIG. 2 is a top perspective view of the dual connector module 102 in accordance with an exemplary embodiment. FIG. 3 is a bottom perspective view of the dual connector module 102 in accordance with an exemplary embodiment. The module circuit board 130 includes front contact pads 160 proximate to the front edge 136 along the lower surface 134 and/or the upper surface 132. The front contact pads 160 define a first connector interface 162 configured for electrically connecting to the first electrical connector 112 (shown in FIG. 1). For example, the first connector interface 162 may be a card edge interface at the front edge 136 configured to be plugged into a card slot of the first electrical connector 112. The front contact pads 160 are circuits of the module circuit board 130. The front contact pads 160 may be electrically connected to corresponding communication components 140 (shown in phantom) via traces on various layers of the module circuit board 130. In an exemplary embodiment, the front contact pads 160 convey high speed data signals. Optionally, various front contact pads 160 may be arranged in pairs configured to carry differential signals.

The module circuit board 130 includes rear contact pads 164 on the lower surface 134 that define a second connector interface 166 configured for electrically connecting to the second electrical connector 116 (shown in FIG. 1). The rear contact pads 164 may be electrically connected to corresponding communication components 140 via traces on various layers of the module circuit board 130. Optionally, at least some of the rear contact pads 164 may be power pads configured to transmit power between the second electrical connector 116 and the module circuit board 130 for powering the communication components 140. Optionally, the rear contact pads 164 may be provided in multiple rows along the lower surface 134. The rear contact pads 164 are provided at an intermediate portion 168 of the module circuit board 130 remote from the front edge 136 and remote from the rear edge 138. Optionally, the rear contact pads 164 are positioned closer to the rear edge 138 than the front edge 136 and may be positioned at the rear edge 138 in some embodiments.

The module circuit board 130 includes notches 172 at the side edges near the intermediate portion 168. The housing 142 includes pockets 174 above the notches 172. The notches 172 and the pockets 174 are configured to receive portions of the second electrical connector 116 during mating of the dual connector module 102 to the second electrical connector 116 (FIG. 2). In an exemplary embodiment, the module circuit board 130 includes landing pads 176 rearward of the notches 172. The landing pads 176 are configured to be engaged by the second electrical connector 116 to mechanically secure the dual connector module 102 to the second electrical connector 116.

The module circuit board 130 includes latching elements 180, such as at the front ends of the notches 172. The latching elements 180 may be defined by edges of the module circuit board 130 defining the notches 172. Alternatively, the latching elements 180 may be separate components mounted to the module circuit board 130 and/or the housing 142. The latching elements 180 are configured to interact with the latch members 146 to secure the module circuit board 130. Optionally, the housing 142 may include the latching elements 180 rather than the module circuit board 130, such as at the front ends of the pockets 174.

The ejector 148 is provided at the rear end of the dual connector module 102. The ejector 148 includes a handle 182 at the rear end configured to be actuated by the operator. The handle 182 is exposed at the rear end, such as rearward of the housing 142. Optionally, the handle 182 may be pivotably coupled to the housing 142. The handle 182 may include gripping features to allow the operator to grip the handle 182. The ejector 148 may include a tether attached to the handle 182 for pulling the ejector 148 for actuating the ejector 148 and/or pulling the dual connector module 102 in the unmating direction. Although the ejector 148 is illustrated as attached to the dual connector module 102, it is contemplated that the ejector 148 could be attached to the second electrical connector 116 in alternative embodiments.

The ejector 148 includes a bar 184 forward of the handle 182. The handle 182 moves the bar 184. The ejector 148 includes release fingers 194 at opposite sides of the dual connector module 102. In the illustrated embodiment, the release fingers 194 extend through sides of the housing 142. The release fingers 194 are coupled to the bar 184 and moved by the bar 184 when the handle 182 is actuated. The release fingers 194 are used to release the latch members 146. The release fingers 194 may extend beyond the sides of the housing 142 to engage the latch members 146.

Figure 4:
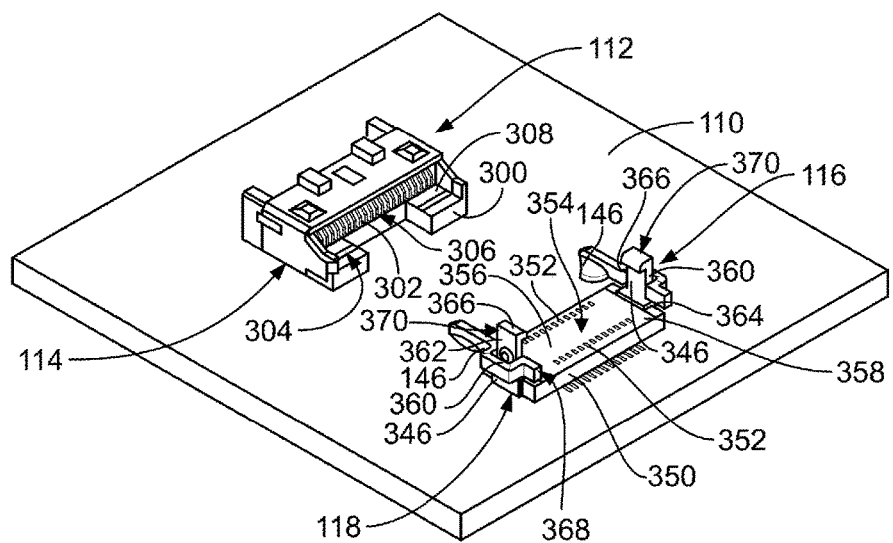
FIG. 4 is a top perspective view of the host circuit board in accordance with an exemplary embodiment.
Figure 5:
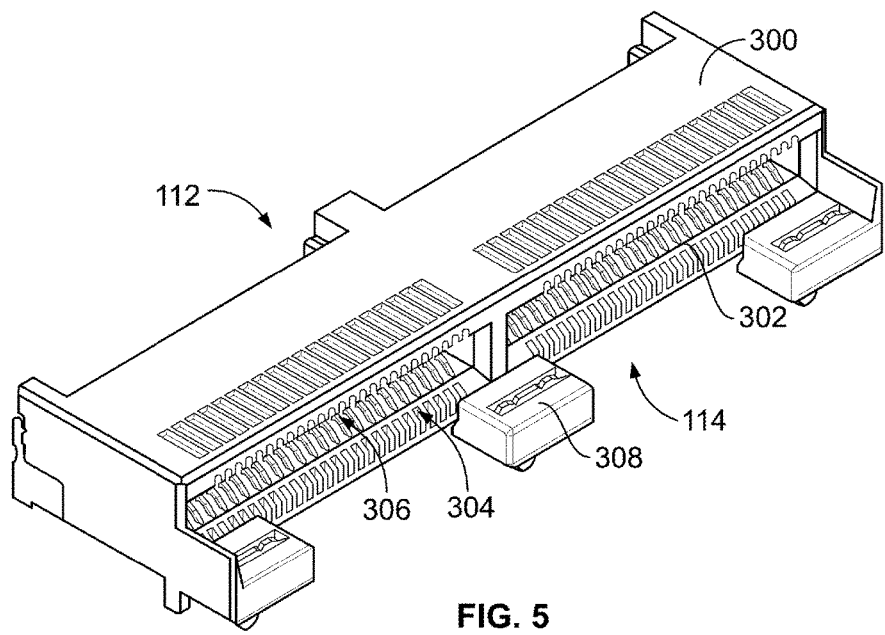
FIG. 5 is a top perspective view of the first electrical connector in accordance with an exemplary embodiment.
Figure 6:
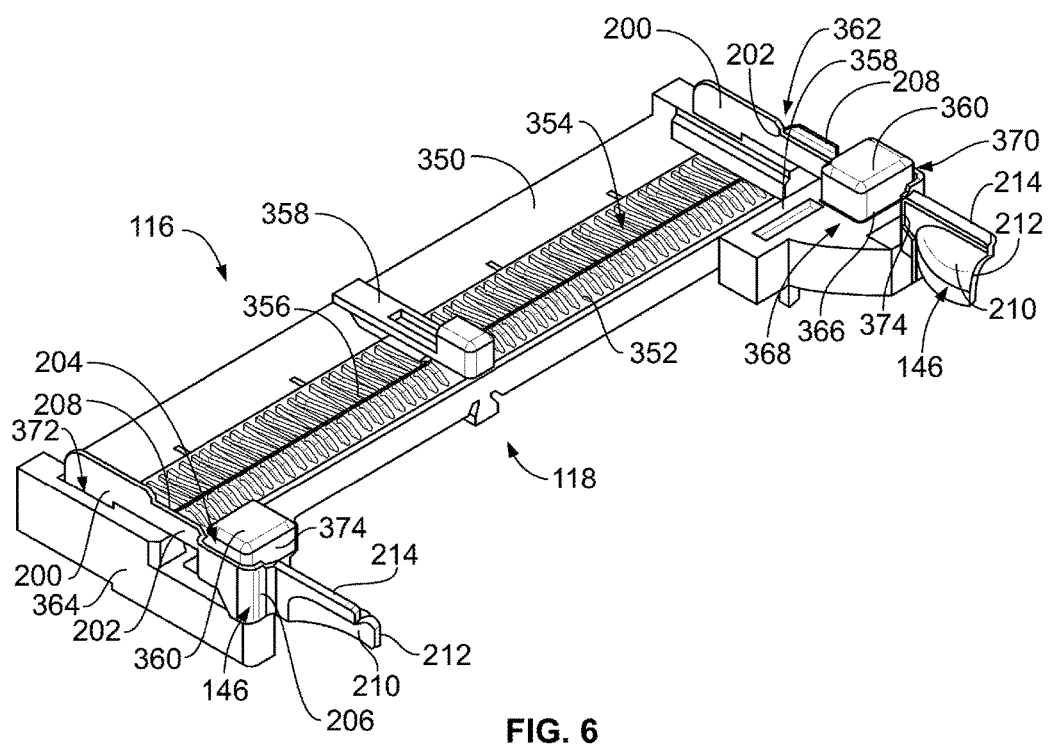
FIG. 6 is a top perspective view of the second electrical connector in accordance with an exemplary embodiment.

FIG. 4 is a top perspective view of the host circuit board 110 in accordance with an exemplary embodiment. FIG. 5 is a top perspective view of the first electrical connector 112. FIG. 6 is a top perspective view of the second electrical connector 116. The host circuit board 110 includes mounting areas for mounting the dual connector module 102 (shown in FIGS. 2 and 3) to the host circuit board 110. The mounting area is subdivided into the front mounting area 114 receiving the first electrical connector 112 and the rear mounting area 118 receiving the second electrical connector 116.

With additional reference to FIGS. 2 and 3 for reference to components of the dual pluggable module 102, the first electrical connector 112 (FIG. 5) includes a housing 300 mounted to the host circuit board 110. The housing 300 holds a plurality of first contacts 302 configured to be terminated to the host circuit board 110. The housing 300 has a mating end 304 configured to be mated with the first connector interface 162 (FIGS. 2 and 3) of the dual connector module 102. In an exemplary embodiment, the first electrical connector 112 includes a card slot 306 at the mating end 304. The first contacts 302 are arranged in the card slot 306 for mating with the first connector interface 162. For example, the first contacts 302 may be arranged in an upper row and a lower row for interfacing with the front contact pads 160 (FIGS. 2 and 3) on the upper surface 132 and the lower surface 134 at the front edge 136 of the module circuit board 130.

The housing 300 includes locating surfaces 308 at the mating end 304 for locating the module circuit board 130 relative to the card slot 306 during mating. For example, the locating surfaces 308 may be upward facing surfaces configured to support the front edge 136 of the module circuit board 130 in the pre-staged position. The module circuit board 130 may slide along the locating surfaces 308 during mating as the front edge 136 of the module circuit board 130 is loaded into the card slot 306. The locating surfaces 308 may support the module circuit board 130 in the mated position to prevent damage to the first contacts 302 from the weight of the dual connector module 102.

The second electrical connector 116 (FIG. 6) includes a housing 350 mounted to the host circuit board 110. The housing 350 holds a plurality of second contacts 352 configured to be terminated to the host circuit board 110. The housing 350 has a mating end 354 (for example, defining the top) configured to be mated with the second connector interface 166 (FIG. 3) of the dual connector module 102. In an exemplary embodiment, the second electrical connector 116 includes an upper mating surface 356 at the mating end 354. The second contacts 352 are arranged along the upper mating surface 356, such as in one or more rows, for mating with the second connector interface 166. The second contacts 352 may include deflectable spring beams configured to be resiliently biased against the second connector interface 166 when the dual connector module 102 is mated to the second electrical connector 116.

The housing 350 includes locating surfaces 358 at the mating end 354 for locating the module circuit board 130 during mating. For example, the locating surfaces 358 may be upward facing surfaces configured to support the intermediate portion 168 of the module circuit board 130. The housing 350 includes towers 360 extending above the locating surfaces 358, such as at opposite sides 362, 364 of the housing 350. The towers 360 may be integral with the base of the housing 350; however, the towers 360 may be separate components mounted to the base of the housing 350 in alternative embodiments. For example, the towers 360 may be die cast metal components attached to a molded plastic base of the housing 350 and/or the host circuit board 110 to provide additional rigidity for support and holding strength for the module circuit board 130 and/or to provide higher precision manufacturing and locating for the module circuit board 130.

The towers 360 include downward facing ledges 366, such as at distal or top ends of the towers 360, extending over the second electrical connector 116. The towers 360 and ledges 366 form J-hooks 370 used for securing the module circuit board 130 to the second electrical connector 116. The towers 360 and the ledges 366 form a gap 368 above the upper mating surface 356 that receives the module circuit board 130. The ledges 366 are configured to engage the upper surface 132 of the module circuit board 130, such as at the landing pads 176 (FIG. 3), to retain the module circuit board 130 in the gap 368 between the ledges 366 and the upper mating surface 356. The ledges 366 prevent lift-off of the module circuit board 130 when the dual connector module 102 is in the mated position. The module circuit board 130 is configured to bypass the towers 360 as the dual connector module 102 is loaded to the pre-staged position, such as by loading the towers 360 through the notches 172; however, when the dual connector module 102 is slid forward to the mated position, the module circuit board 130 is slid under the ledges 366 to the mated position.

The module circuit board 130 may slide along the locating surfaces 358 during mating as the front edge 136 of the module circuit board 130 is loaded into the card slot 306. The locating surfaces 358 may support the module circuit board 130, such as at the intermediate portion 168, in the mated position to prevent damage to the second contacts 352 from the weight of the dual connector module 102.

In an exemplary embodiment, the latch members 146 are coupled to the housing 350, such as at opposite sides of the housing 350. The latch members 146 may be stamped and formed from sheet metal and coupled to the housing 350 for interfacing with the dual connector module 102 and securing the dual connector module 102 in the mated position. Each latch member 146 includes a base 200 coupled to the housing 350. The base 200 may be received in a slot 372 in the housing 350 and held therein by an interference fit, adhesive, a fastener, or other securing means.

Each latch member 146 includes a beam 202 extending from the base 200. The beam 202 may extend forward from the base 200. The beam 202 is deflectable and may be elastically deformed during latching and unlatching. For example, the latch member 146 may be pivotably coupled to the housing 350 at the base 200 with the beam 202 being flexed outward from the base 200 to an unlatched position. The beam 202 may be spring biased toward the housing 350 to spring into a latching position to hold the dual connector module 102 in the first and second electrical connectors 112, 116. In an exemplary embodiment, the beam 202 is bent to include a pocket 204 that receives the corresponding tower 360. For example, the beam 202 extends around the exterior of the tower 360. The beam 202 includes an abutment shoulder 206 at a front of the pocket 204. The abutment shoulder 206 is configured to abut against a front end 374 of the tower 360 to support the distal end of the beam 202 against buckling. The beam 202 includes an ejector release tab 208 at a top of the beam 202. The ejector release tab 208 is configured to engage the release finger 194 of the ejector 148 when the ejector 148 is actuated. For example, as the release finger 194 is moved downward during actuation, the release finger 194 engages the ejector release tab 208 to force the latch member 146 outward to the unlatched position. Optionally, the ejector release tab 208 may be angled or curved outward to form a ramp surface that the release finger 194 rides along to force the latch member 146 outward to the unlatched position.

Each latch member 146 includes a latching tab 210 at the distal end of the beam 202. The latching tab 210 is used to latchably secure the dual connector module 102 in the first and second electrical connectors 112, 116. The latching tab 210 has a latching surface 212 configured to engage the dual connector module 102, such as the latching element 180 in the latched position. The latching tab 210 includes a board release tab 214 at a top of the latching tab 210. The board release tab 214 is configured to engage the module circuit board 130 during loading of the module circuit board 130 into position on the second electrical connector 116. For example, as the module circuit board 130 is lowered into position, the module circuit board 130 engages the board release tab 214 to force the latch member 146 outward to the unlatched position. Optionally, the board release tab 214 may be angled or curved outward to form a ramp surface that the module circuit board 130 rides along to force the latch member 146 outward to the unlatched position.

Figure 8:
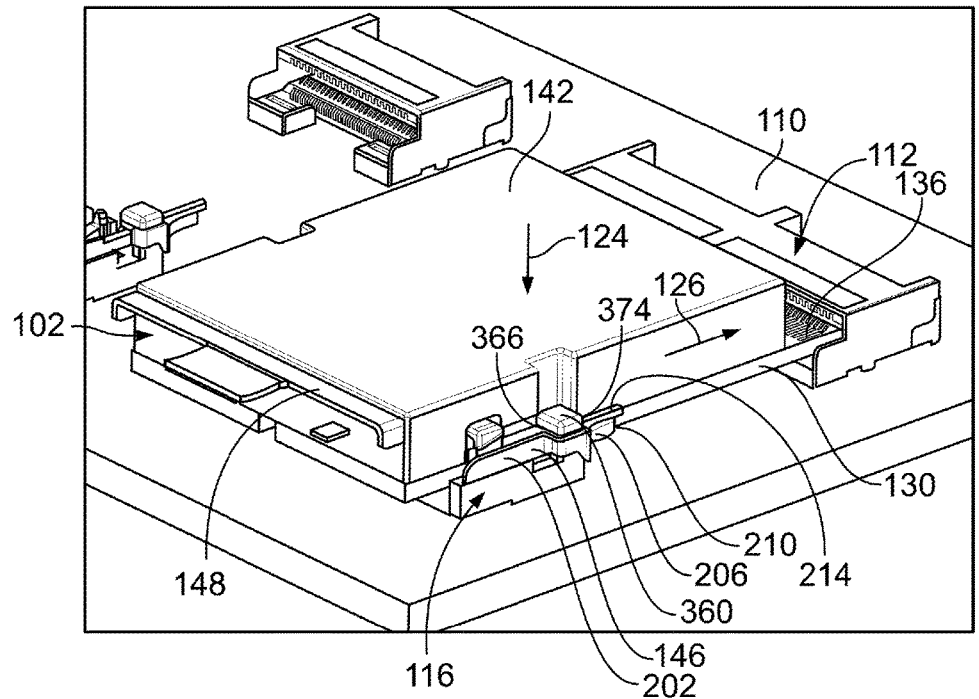
FIG. 8 shows the dual connector module in a pre-staged position on the host circuit board.
Figure 9:
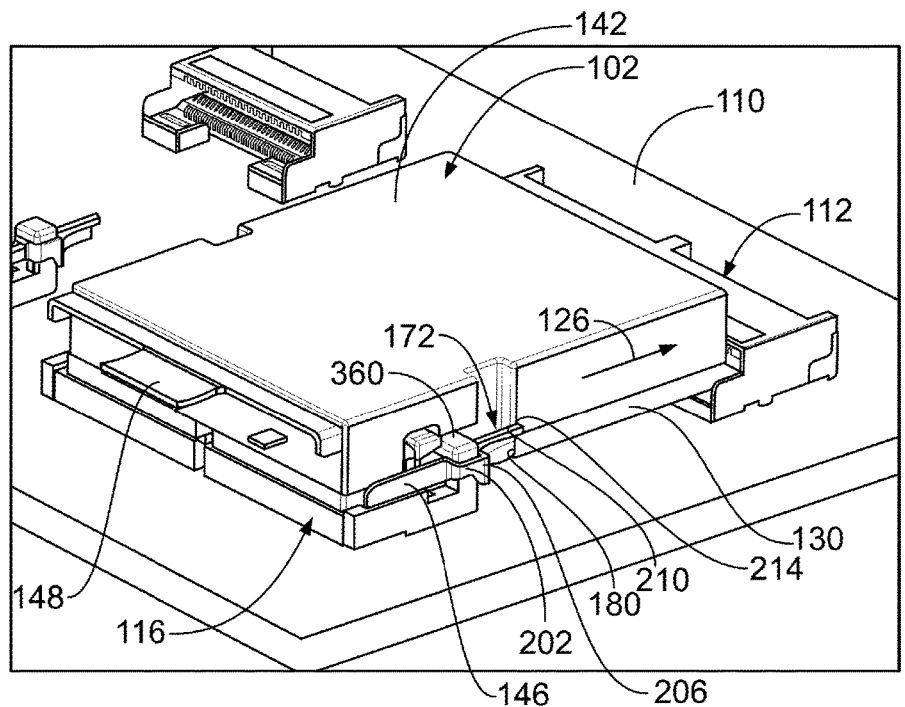
FIG. 9 shows the dual connector module in a mated position on the host circuit board.

FIGS. 7 through 9 show a mating sequence of the dual connector module 102 to the host circuit board 110. FIG. 7 shows the dual connector module 102 poised for coupling to the host circuit board 110 at an elevated positioned above the host circuit board 110. FIG. 8 shows the dual connector module 102 in a pre-staged, unmated position. FIG. 9 shows the dual connector module 102 in a mated position.

In an exemplary embodiment, mating of the dual connector module 102 to the host circuit board 110 occurs by loading the dual connector module 102 in the loading direction 124 to the pre-staged, unmated position (FIG. 8), such as by loading the dual connector module 102 downward onto the first and second electrical connectors 112, 116. Once positioned, the dual connector module 102 is mated to the first and second electrical connectors 112, 116 by moving the dual connector module 102 in the mating direction 126 to the mated position (FIG. 9).

During assembly, the first connector interface 162 is generally aligned above the first electrical connector 112 and the second connector interface 166 is generally aligned above the second electrical connector 116 (FIG. 7) and the module circuit board 130 is lowered into position on the first and second electrical connectors 112, 116 to the pre-staged position (FIG. 8). In various embodiments, the notches 172 are vertically aligned with the J-hooks 370 of the second electrical connector 116 during loading. The dual connector module 102 can be moved downward until the module circuit board 130 engages the mating side of the second electrical connector 116. The front edge 136 of the module circuit board 130 rests on, and is supported by, the first electrical connector 112 in the pre-staged, unmated position. As the module circuit board 130 is lowered, the tower 360 of the second electrical connector 116 extends into the notch 172 in the module circuit board 130. The module circuit board 130 engages the board release tab 214 as the module circuit board 130 is lowered forcing the latch members 146 outward to an unlatched position.

In the pre-staged position (FIG. 8), the latch members 146 are shown deflected outward to the unlatched position. The latching tabs 210 do not engage the latching elements 180 in the unlatched position, rather, the interior surfaces of the latching tabs 210 engage the sides of the module circuit board 130 and/or the housing 142. In various embodiments, the module circuit board 130 is disposed on the second electrical connector 116 and the card edge is disposed on a ledge of the first electrical connector 112. The J-hook is in the notch 172 just above the module circuit board 130. The dual connector module 102 can be moved forward parallel to the host circuit board to install the card edge in the first electrical connector 112.

As the dual connector module 102 is moved from the pre-staged, unmated position (FIG. 8) to the mated position (FIG. 9), the dual connector module 102 is slid forward in the mating direction 126. In the mated position, the module circuit board 130 rearward of the notch 172 is moved forward in line with the tower 360. For example, the module circuit board 130 is slid forward relative to the second electrical connector 116. In the mated position, the ledge 366 of the tower 360 is positioned above the landing pad 176 of the module circuit board 130 to hold the vertical position of the module circuit board 130 within the second electrical connector 116. For example, the module circuit board 130 is captured between the ledge 366 and the upper mating surface 356. The ledge 366 prevents lift-off of the module circuit board 130 from the upper mating surface 356.

When mated, the notches 172 are slid forward into alignment with the latching tabs 210. The latching tabs 210 snap inward into the notches 172 to the latching position (FIG. 9). The latching tabs 210 engage the latching elements 180 in the latching position. The latching tabs 210 block removal of the module circuit board 130 from the first electrical connector 112. The abutment shoulder 206 engages the front end 374 of the tower 360 to hold the latching tab 210 and resist buckling of the beam 202.

When the ejector 148 is operated (for example, pushed downward), the latch members 146 are released to the unlatched position. In such position, the latching tabs 210 no longer engage the latching elements 180 and no longer block the dual connector module 102 from moving rearward.

FIG. 10 is a top view of the dual connector system 100 showing the dual connector module 102 in the pre-staged, unmated position. The front edge 136 of the module circuit board 130 is aligned with the first electrical connector 112 but not loaded into the card slot of the first electrical connector 112. In the pre-staged position, the rear end of the dual connector module 102 rests on the second electrical connector 116 and holds the latch members 146 outward in the unlatched position. In this position the resilient beams 202 of the latch members 146 are flexed outwardly due to engagement of the latching tabs 210 by bottom outer edges of the dual connector module 102. The J-hooks 370 are in the notches 172.

FIG. 11 is a perspective view of a portion of the dual connector system 100 showing the dual connector module 102 in the pre-staged, unmated position. The tower 360 is received in the notch 172 and the pocket 174. The latching tab 210 engages the side of the module circuit board 130 and/or the housing 142 and is hold outward in the unlatched position. The beam 202 is forced outward away from the tower 360. FIG. 11 shows the latch member 146 relative to one of the J-hooks 370 when the dual connector module 102 is in the intermediate position. The J-hook 370 is disposed in the notch 172 and/or the pocket 174 above the module circuit board 130.

Figure 12:
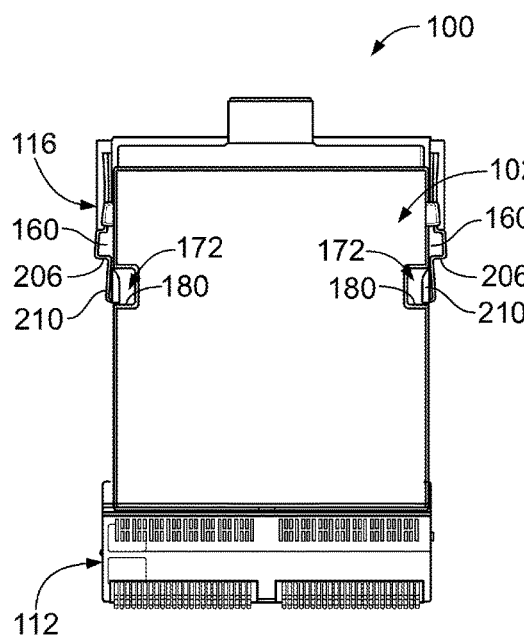
FIG. 12 is a top view of a portion of the dual connector system in a mated position with the first and second electrical connectors.

FIG. 12 is a top view of the dual connector system 100 showing the dual connector module 102 in the mated position. The module circuit board 130 is plugged into the first electrical connector 112. In the mated position, module circuit board 130 is electrically coupled to the first and second electrical connectors 112, 116. When the module circuit board 130 is slid forward to the mated position, the notches 172 are slid forward into alignment with the latching tabs 210. The latching tabs 210 engage the latching elements 180. The latching tabs 210 hold the module circuit board 130 in the first electrical connector 112 and block unloading of the module circuit board 130 from the first electrical connector 112. The abutment shoulders 206 engage the towers 360 creating a short arm to resist buckling pressure.

Figure 13:
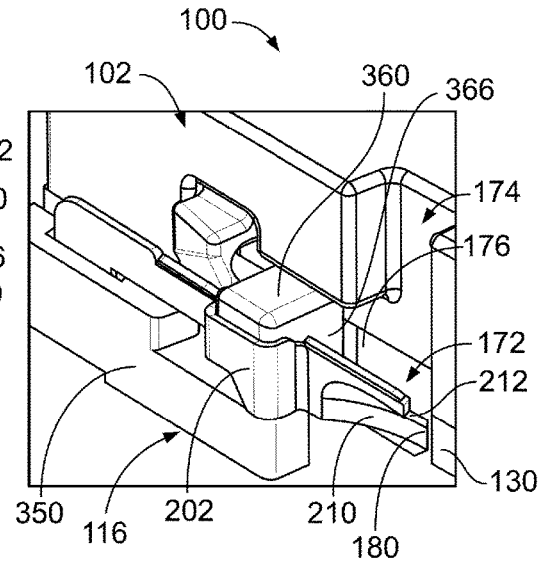
FIG. 13 is a perspective view of a portion of the dual connector system in a mated position with a latch member in a latched position.

FIG. 13 is a perspective view of a portion of the dual connector system 100 showing the dual connector module 102 in the mated position. The ledge 366 of the tower 360 is positioned above the landing pad 176 of the module circuit board 130 to hold the vertical position of the module circuit board 130 within the second electrical connector 116. The latching tab 210 is received in notch 172 to engage the latching element 180. The beam 202 rests flush against the side of the housing 350 and the tower 360. In this position the J-hook is disposed in the cutout defined by the pocket 174. The notch 172 has moved beyond the latching tab 210, thereby allowing the resilient beam 202 to resile against the tower 360 of the J-hook and allowing the latching tab 210 to enter the notch 172. The latching surface 212 of the latching tab 210 engages the latching element 180 defining a surface of the notch 172, thereby preventing withdrawal of the dual connector module 102 from the fully installed position in the first and second connector assemblies 112, 116.

Figure 14:
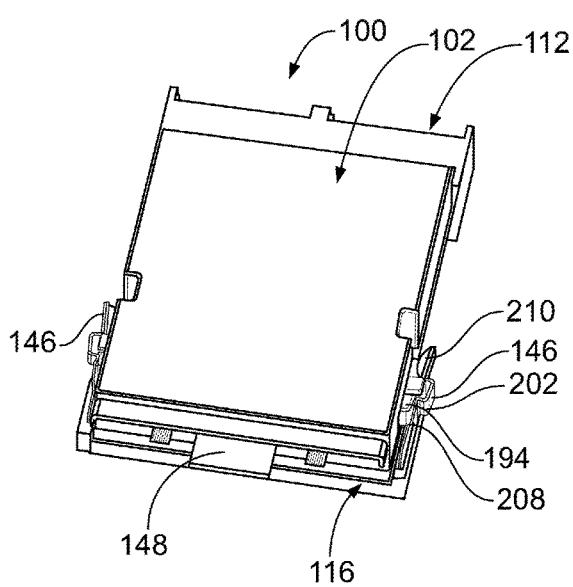
FIG. 14 is a top perspective view of the dual connector module showing the latch member in an unlatched position.

FIG. 14 is a top perspective view of the dual connector system 100 showing the dual connector module 102 being unlatched from the second electrical connector 116. The ejector 148 is actuated to unlatch the latch members 146. The release fingers 194 are driven into the ejector release tabs 208 to force the beams 202 and the latching tabs 210 outward to the unlatched positions. In the unlatched position, the dual connector module 102 may be pulled rearward to unmate the dual connector module 102 from the first and second electrical connectors 112, 116.

Figure 15:
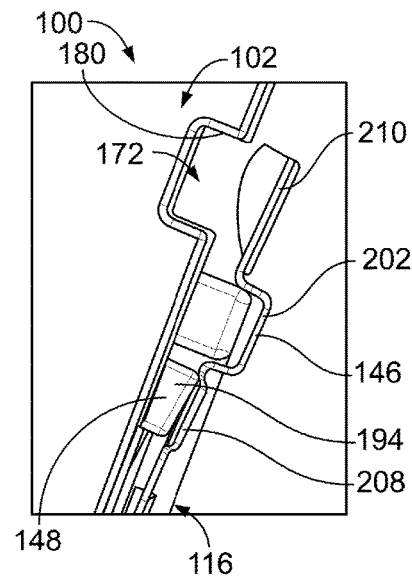
FIG. 15 is a perspective view of a portion of the dual connector system in a mated position with the latch member in an unlatched position.

FIG. 15 is a perspective view of a portion of the dual connector system 100 showing the latch member 146 in the unlatched position. The release finger 194 is pressed into the ejector release tabs 208 to move the beam 202 and the latching tab 210 outward to the unlatched positions. The latching tab 210 does not block the latching element 180 in the unlatched position. As the ejector 148 is depressed, the release finger 194 engages the ejector release tab 208 of the latch member 146 and deflects the resilient beam 202 outwardly from the dual connector module 102. The latching tab 210 is moved out of the notch 172, thereby allowing the dual connector module 102 to be moved horizontally along the host circuit board rearwardly to unmate from the first electrical connector 112. In the unmated position, the J-hook is in the notch 172 and is disengaged from the top surface of the module circuit board 130. The dual connector module 102 is then able to be moved vertically away from the host circuit board 100 and the electrical connectors 112, 116 to unmate from the electrical connectors 112, 116.

Embodiments described herein provide a dual connector module 102 that can be used with electrical connectors 112, 116. Electronic components mounted on the module circuit board 130 are electrically connected to conductive traces (not shown) that electrically connect to contact pads along the front edge 136, which defines a card edge of the dual connector module 102. The dual connector module 102 has an ejector 148 including a pair of latch release tabs or fingers 194 that are operable to disengage the latch members 146 from the dual connector module 102 from notches 172 and latching elements 180 of the dual connector module 102.

In various embodiments, the first and second electrical connectors 112, 116 are separate, independent connectors; however, it should be understood that the first and second electrical connectors 112, 116 may be integrated into a single element wherein the first and second electrical connectors 112, 116 are physically connected together by a body such that the first and second electrical connectors 112, 116 can be placed on the host circuit board as a unit. In various embodiments, the first electrical connector 116 is a right angle connector having a dielectric housing having a mating side, a top side and a bottom or mounting side. The housing defines a cavity that is open through the mating side. The housing holds a plurality of contacts that are exposed in the cavity and arrayed for engagement with the contact pads on the card edge of the dual connector module 102. The contacts extend in the housing to the mounting side for termination to the host circuit board. In various embodiments, the second electrical connector may be a Z-axis connector including a dielectric housing having a top or mating side and a bottom or mounting side. The housing holds a plurality of contacts that are exposed along the mating side for engagement with contact pads along a bottom of the module circuit board 130. The second electrical connector has a pair of latch members 146 mounted at opposite sides of the housing. Each of the latch members 146 has an end secured to the housing, a resilient beam that can be flexed outwardly in a direction away from the housing, and a latching tab for securing the dual connector module 102 to the electrical connectors 112, 116. The resilient beams may wrap around J-hooks 370 of the housing used to secure the module circuit board 130 to the second electrical connector 116.

In various embodiments, in the mated position and prior to actuation of the ejector 148, the release fingers 194 are disengaged from the latch members 146. The ejector 148 is attached to the dual connector module 102 to allow pivoting of the ejector 148 or sliding movement of the ejector 148, such as in a horizontal direction or a vertical direction. The ejector 148 is preferably spring biased to the unactuated position. The ejector 148 has a handle that can be actuated by a user, such as depressed in a downward direction to move the ejector to an actuated position, wherein the release fingers 194 become engaged with the latch members 146, such as the ejector release tabs 208.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A dual connector system comprising:
a host circuit board having a front mounting area and a rear mounting area;
a first electrical connector at the front mounting area of the host circuit board, the first electrical connector having a housing having a card slot;
a second electrical connector at the rear mounting area of the host circuit board, the second electrical connector having a housing having an upper mating surface, the second electrical connector having a latch member coupled to the housing, the latch member having a latching tab;
a dual connector module movable between a mated position and an unmated position with the first and second electrical connectors, the dual connector module having a module circuit board including an upper surface and a lower surface facing the host circuit board, the module circuit board having at least one communication component on the upper surface, the module circuit board having first and second side edges extending between a front edge and a rear edge, the module circuit board having front contact pads proximate to the front edge for electrically connecting to the first electrical connector, the module circuit board having rear contact pads remote from the front edge for electrically connecting to the second electrical connector, the dual connector module having a latching element proximate to the rear contact pads, the latching element engages the latching tab to hold the dual connector module in the mated position with the first electrical connector and the second electrical connector; and
an ejector coupled to the dual connector module, the ejector being actuated to release the latching tab from the latch member to allow the dual connector module to unmate from the first electrical connector and the second electrical connector.

2. The dual connector system of claim 1, wherein the ejector includes a handle actuated to release the latching tab, the handle being pulled in a direction away from the first electrical connector to unmate the dual connector module from the first electrical connector.

3. The dual connector system of claim 1, wherein the latching member is on the first side of the module circuit board, the latching tab engages the latching member on the module circuit board to hold the module circuit board in the first electrical connector.

4. The dual connector system of claim 1, wherein the latch member includes a base coupled to the housing of the second electrical connector and a beam extending from the base, the latching tab being provided at a distal end of the beam.

5. The dual connector system of claim 4, wherein the latch member includes a pocket receiving a tower of the housing of the second electrical connector, the tower having a hook configured to engage and secure the module circuit board to the second electrical connector, the beam extending around a side of the tower to a front of the tower, the latching tab extending forward of the tower.

6. The dual connector system of claim 4, wherein the beam includes an abutment shoulder rearward of the latching tab, the abutment shoulder engaging the housing of the second electrical connector to support the latching tab.

7. The dual connector system of claim 1, wherein the module circuit board includes a notch in the first side, the latching tab being received in the notch and engaging the latching element at the front of the notch.

8. The dual connector system of claim 1, wherein the latching tab includes a board release tab at a top of the latching tab, the board release tab configured to engage the module circuit board as the module circuit board is being loaded downward onto the second electrical connector to force the latching tab outward to an unlatched position.

9. The dual connector system of claim 8, wherein the dual connector module is slid forward to a mated position, the latching tab springing inward to a latched position against the latching element when the dual connector module is slid forward to the mated position.

10. The dual connector system of claim 1, wherein the latch member includes an ejector release tab at a top of the latch member, the ejector engaging the ejector release tab when actuated to force the latch member outward to an unlatched position.

11. The dual connector system of claim 10, wherein the ejector includes a release finger aligned with the ejector release tab, the release finger engaging the ejector release tab when the ejector is actuated to move the latching tab to the unlatched position.

12. A dual connector system comprising:
a host circuit board having a front mounting area and a rear mounting area;
a first electrical connector at the front mounting area of the host circuit board, the first electrical connector having a housing having a card slot, the housing holding first contacts at the card slot;
a second electrical connector at the rear mounting area of the host circuit board, the second electrical connector having a housing having an upper mating surface, the housing holding second contacts at the upper mating surface, the second electrical connector having a latch member coupled to the housing of the second electrical connector, the latch member having a latching tab;
a dual connector module matable with the first and second electrical connectors at first and second connector interfaces of the dual connector module, the dual connector module having a module circuit board including an upper surface and a lower surface facing the host circuit board, the module circuit board having at least one communication component on the upper surface, the module circuit board having first and second side edges extending between a front edge and a rear edge, the module circuit board having front contact pads proximate to the front edge for electrically connecting to the first electrical connector, the module circuit board having rear contact pads remote from the front edge for electrically connecting to the second electrical connector, the dual connector module having a latching element proximate to the rear contact pads, the latching element engages the latching tab to hold the dual connector module in the mated position with the first electrical connector and the second electrical connector, wherein the dual connector module is coupled to the host circuit board by lowering the dual connector module in a loading direction generally perpendicular to the host circuit board to a pre-staged, unmated position where the first connector interface is adjacent to the first electrical connector and the second connector interface is adjacent to the second electrical connector, the latching tab being unmated from the latching element in the unmated position, and wherein the dual connector module is slid forward from the pre-staged, unmated position to a mated position in a mating direction generally parallel to the upper surface of the host circuit board to mate the first connector interface to the first electrical connector by loading the front edge of the module circuit board into the card slot of the first electrical connector to mate the first contacts to the first contact pads and to mate the second connector interface to the second electrical connector to mate the second contacts to the second contact pads, the latching tab engaging the latching element in the mated position; and
an ejector coupled to the dual connector module, the ejector being actuated to release the latching tab from the latch member to allow the dual connector module to unmate from the first electrical connector and the second electrical connector and move to the unmated position.

13. The dual connector system of claim 12, wherein the ejector includes a handle actuated to release the latching tab, the handle being pulled in a direction away from the first electrical connector to unmate the dual connector module from the first electrical connector.

14. The dual connector system of claim 12, wherein the latch member includes a base coupled to the housing of the second electrical connector and a beam extending from the base, the latching tab being provided at a distal end of the beam.

15. The dual connector system of claim 14, wherein the latch member includes a pocket receiving a tower of the housing of the second electrical connector, the tower having a hook configured to engage and secure the module circuit board to the second electrical connector, the beam extending around a side of the tower to a front of the tower, the latching tab extending forward of the tower.

16. The dual connector system of claim 14, wherein the beam includes an abutment shoulder rearward of the latching tab, the abutment shoulder engaging the housing of the second electrical connector to support the latching tab.

17. The dual connector system of claim 12, wherein the module circuit board includes a notch in the first side, the latching tab being received in the notch and engaging the latching element at the front of the notch.

18. The dual connector system of claim 12, wherein the latching tab includes a board release tab at a top of the latching tab, the board release tab configured to engage the module circuit board as the module circuit board is being loaded downward onto the second electrical connector to force the latching tab outward to an unlatched position.

19. The dual connector system of claim 12, wherein the latch member includes an ejector release tab at a top of the latch member, the ejector engaging the ejector release tab when actuated to force the latch member outward to an unlatched position.

20. The dual connector system of claim 19, wherein the ejector includes a release finger aligned with the ejector release tab, the release finger engaging the ejector release tab when the ejector is actuated to move the latching tab to the unlatched position.

* * * * *